(12) United States Patent
Yang et al.

(10) Patent No.: US 12,366,799 B2
(45) Date of Patent: Jul. 22, 2025

(54) APPARATUS FOR CORRECTING PHOTOMASK AND METHOD THEREOF

(71) Applicant: SEMES CO., LTD., Chungcheongnam-do (KR)

(72) Inventors: Hyo Won Yang, Seoul (KR); Hyun Yoon, Gyeonggi-do (KR); Ji Hoon Jeong, Gyeonggi-do (KR); In Ki Jung, Gyeonggi-do (KR); Ki Hoon Choi, Chungcheongnam-do (KR); Tae Hee Kim, Gyeonggi-do (KR); Se Hoon Oh, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 538 days.

(21) Appl. No.: 17/899,616

(22) Filed: Aug. 31, 2022

(65) Prior Publication Data
US 2023/0229074 A1    Jul. 20, 2023

(30) Foreign Application Priority Data
Dec. 30, 2021    (KR) .......................... 10-2021-0191908

(51) Int. Cl.
*G03F 1/72*    (2012.01)
*G03F 7/00*    (2006.01)

(52) U.S. Cl.
CPC ............ *G03F 1/72* (2013.01); *G03F 7/70025* (2013.01); *G03F 7/70558* (2013.01)

(58) Field of Classification Search
CPC ...................................... G03F 1/72; G03F 1/80
See application file for complete search history.

(56) References Cited

U.S. PATENT DOCUMENTS

| | | | |
|---|---|---|---|
| 9,417,519 B2 * | 8/2016 | Mulkens | G03F 7/7065 |
| 9,612,205 B2 | 4/2017 | IvanPetrov et al. | |
| 9,632,407 B2 * | 4/2017 | Sato | G03F 1/72 |
| 11,710,670 B2 | 7/2023 | Ansell et al. | |
| 2019/0107783 A1 * | 4/2019 | Thaler | G03F 1/72 |
| 2022/0283512 A1 * | 9/2022 | Park | G03F 7/70625 |
| 2023/0067973 A1 * | 3/2023 | Kim | H01L 21/67742 |

(Continued)

FOREIGN PATENT DOCUMENTS

| | | |
|---|---|---|
| JP | 2000-156342 | 6/2000 |
| JP | 2015-45520 | 3/2015 |

(Continued)

OTHER PUBLICATIONS

Office Action dated Apr. 30, 2024 for Korean Patent Application No. 10-2021-0191908 and its English translation from Global Dossier.

(Continued)

*Primary Examiner* — Stewart A Fraser
(74) *Attorney, Agent, or Firm* — WOMBLE BOND DICKINSON (US) LLP

(57) ABSTRACT

A photomask correction method capable of increasing the photomask precision is provided. The photomask correction method comprises measuring an intensity profile of a laser, acquiring etching amount data corresponding to the measured intensity profile using a library, determining a process parameter of the laser based on the etching amount data, and correcting a photomask with the laser according to the determined process parameter.

20 Claims, 13 Drawing Sheets

(56) References Cited

U.S. PATENT DOCUMENTS

2023/0185206 A1*  6/2023  Kim .................. G03F 7/70875
                                                  156/345.19
2023/0343597 A1   10/2023  Horikiri et al.

FOREIGN PATENT DOCUMENTS

| | | |
|---|---|---|
| JP | 6942291 | 9/2021 |
| KR | 10-0916694 | 9/2009 |
| KR | 10-1476370 | 12/2014 |
| KR | 10-2017-0114655 | 10/2017 |
| KR | 10-2019-0037379 | 4/2019 |
| KR | 10-2020-0088794 | 7/2020 |
| KR | 10-2021-0054447 | 5/2021 |
| KR | 10-2021-0076448 | 6/2021 |
| KR | 10-2274476 | 7/2021 |

OTHER PUBLICATIONS

Notice of Allowance dated Nov. 12, 2024 for Korean Patent Application No. 10-2021-0191908 and its English translation by Google Translate.

* cited by examiner

| INTENSITY PROFILE | PROCESS PARAMETER | ETCHING AMOUNT |
|---|---|---|
| 5 | C11 | 100 |
| | C12 | 150 |
| 10 | C21 | 200 |
| | C22 | 250 |
| 15 | C31 | 300 |
| | C32 | 350 |
| ⋮ | ⋮ | ⋮ |
| 50 | C91 | 500 |
| | C92 | 550 |

APPARATUS FOR CORRECTING PHOTOMASK AND METHOD THEREOF

This application claims the benefit of Korean Patent Application No. 10-20201-0191908, filed on Dec. 30, 2021 in the Korean Intellectual Property Office, the disclosure of which is incorporated herein by reference in its entirety.

BACKGROUND

1. Field

The present invention relates to a photomask correction apparatus and method.

2. Description of the Related Art

When manufacturing a semiconductor device or a display device, various processes such as photography, etching, ashing, ion implantation, thin film deposition, and cleaning are performed. Here, the photography process includes coating, exposure, and developing processes. A photosensitive film is formed on a substrate (i.e., a coating process), a circuit pattern is exposed on the substrate, on which the photosensitive film is formed (i.e., an exposure process), and an exposed region of the substrate is selectively developed (i.e., a developing process).

SUMMARY

On the other hand, a photomask used in an exposure process should meet high requirements regarding transmission homogeneity, flatness, pureness, and temperature stability. In addition, the photomask should have high precision, and for this purpose, a correction process is performed on the photomask before use.

An object of the present invention is to provide a photomask correction method capable of increasing the precision of the photomask.

Another object of the present invention is to provide a photomask correction apparatus capable of increasing the precision of the photomask.

The objects of the present invention are not limited to the objects mentioned above, and other objects not mentioned will be clearly understood by those skilled in the art from the following description.

One aspect of the photomask correction method of the present invention for achieving the above object comprises measuring an intensity profile of a laser, acquiring etching amount data corresponding to the measured intensity profile using a library, determining a process parameter of the laser based on the etching amount data, and correcting a photomask with the laser according to the determined process parameter.

Another aspect of the photomask correction method of the present invention for achieving the above object comprises measuring an intensity profile of a laser provided from a laser generator using a beam profiler installed in a home port while the laser generator stands by at the home port, forming a liquid film by supplying a chemical solution on a photomask including a first region and a second region, acquiring etching amount data corresponding to the measured intensity profile by using a library including a plurality of intensity profiles and a plurality of etching amount data corresponding to the plurality of intensity profiles, determining an irradiation time of the laser based on the etching amount data, and heating a liquid film in the second region with the laser for the determined irradiation time, and not heating a liquid film in the first region.

One aspect of the photomask correction apparatus of the present invention for achieving the above another object comprises a process chamber; a support unit installed in the process chamber and for supporting a photomask; a chemical solution supply unit installed in the process chamber and for supplying a chemical solution to the photomask to form a liquid film; a laser module installed in the process chamber and including a laser generator for irradiating a laser to the liquid film; a home port for measuring an intensity profile of the laser, in which the laser generator stands by; a storage unit for storing a library including a plurality of intensity profiles and a plurality of etching amount data corresponding to the plurality of intensity profiles; and a controller for acquiring etching amount data corresponding to the measured intensity profile using the library, determining a process parameter of the laser based on the etching amount data, and correcting a photomask with the laser according to the determined process parameter.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIGS. 4 and 5 are views for describing a library stored in the storage unit of FIG. 2;

DETAILED DESCRIPTION

Figure 1:
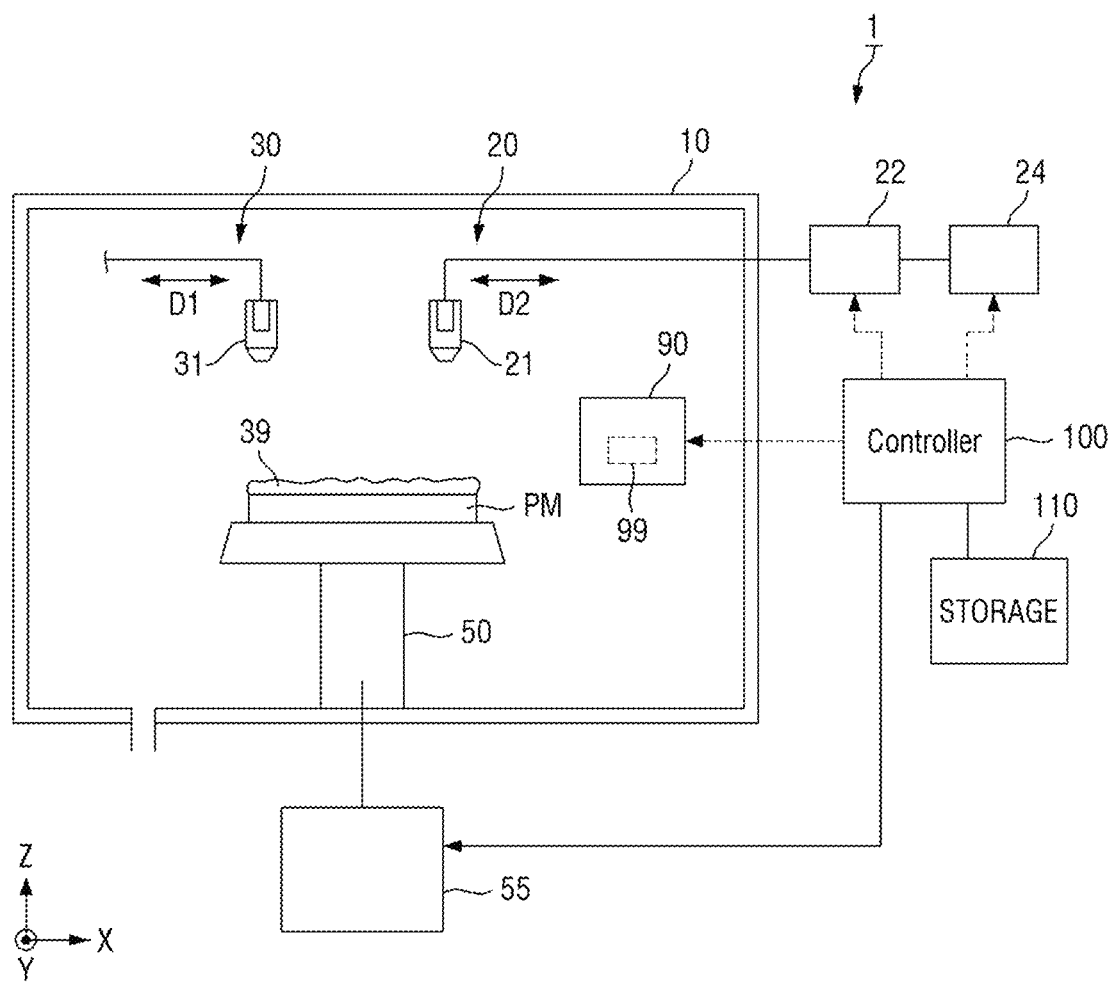
FIG. 1 is a conceptual diagram for describing a photomask correction apparatus according to some embodiments of the present invention.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

Figure 2:
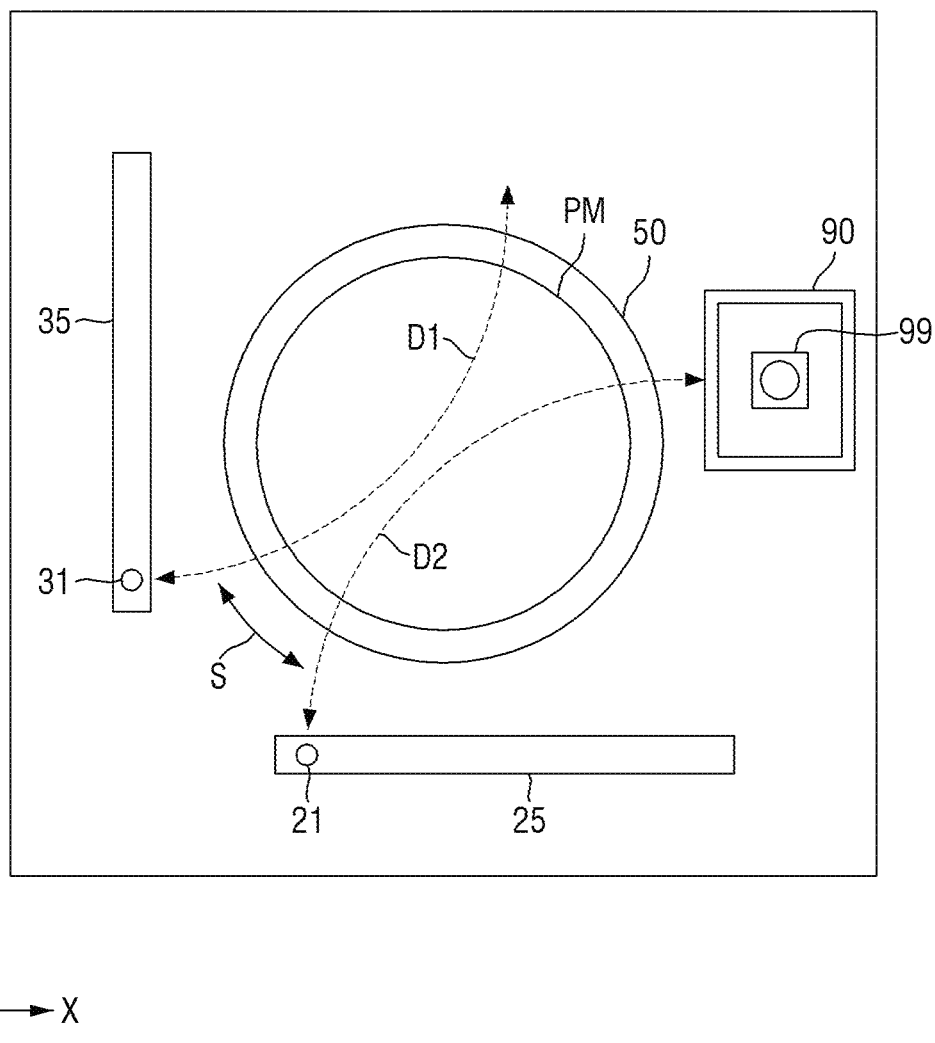
FIG. 2 is a plan view for describing the photomask correction apparatus of FIG. 1.
Figure 3:
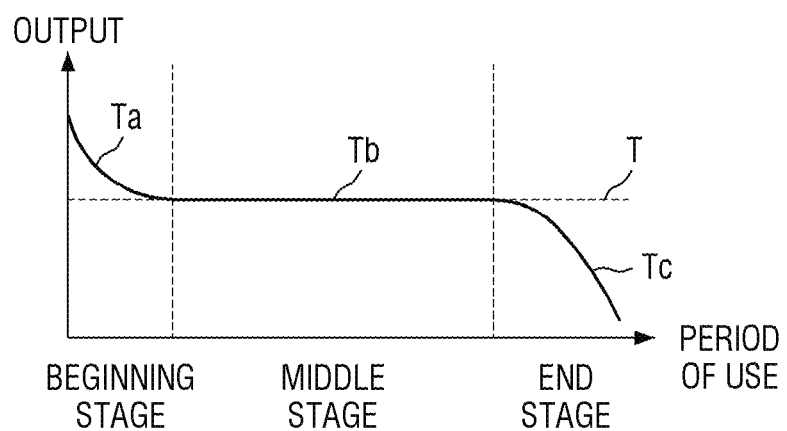
FIG. 3 is a view for describing the output of the laser generator according to the period of use.

FIG. 1 is a conceptual diagram for describing a photomask correction apparatus according to some embodiments of the present invention. FIG. 2 is a plan view for describing the photomask correction apparatus of FIG. 1. FIG. 3 is a view for describing the output of the laser generator according to the period of use.

First, referring to FIGS. 1 and 2, the photomask correction apparatus 1 according to some embodiments of the present invention includes a process chamber 10, a support unit 50, a chemical solution supply unit 30, a laser module 20, a home port 90, a controller 100, a storage unit 110, and the like.

The process chamber 10 provides a processing space, in which a correction process is performed.

The support unit 50 supports the photomask PM in the processing space of the process chamber 10. For example, the body of the support unit 50 has an upper surface provided with a generally circular shape when viewed from above. The support unit 50 may be rotated by the driving unit 55. In addition, the support unit 50 may be moved up and down by the driving unit 55.

The chemical solution supply unit 30 supplies the chemical solution onto the photomask PM. The chemical solution supply unit 30 includes a nozzle 31, a nozzle support 35, and a chemical solution storage unit (not shown). The nozzle 31 may be located on the upper side of the support unit 50 (i.e., upper side in the Z direction). The nozzle 31 is installed at one end of the nozzle support 35, and the nozzle support 35 may perform an arc motion (see D1 of FIG. 2), but is not limited thereto. According to the movement of the nozzle support 35, the nozzle 31 stands by at the first standby position and then moves to the first supply position to supply the chemical solution onto the photomask PM. The chemical solution is for etching the photomask PM, and may vary depending on the material of the photomask PM.

After the chemical solution supply unit 30 supplies the chemical solution onto the photomask PM, the laser module 20 irradiates a laser to heat the chemical solution supplied to the photomask PM. The etching amount of the photomask PM generated by the chemical solution heated by the laser is greater than the etching amount of the photomask PM generated by the chemical solution that is not heated. The etching amount of the photomask PM varies according to the degree of heating by the laser. In this regard, it will be described later with reference to FIGS. 7 to 11.

The laser module 20 includes a laser generator 21, a support 25, a driving unit 22, and a power supply unit 24. The laser generator 21 may be located on the upper side of the support 25 (i.e., on the upper side in the Z direction). The laser generator 21 receives power from the power supply unit 24 to generate a laser. The laser generator 21 may include, for example, a laser diode. The laser generator 21 is installed at one end of the support 25, and the support 25 may perform an arc motion by the driving unit 22 (see D2 of FIG. 2), but is not limited thereto. According to the movement of the support 25, the laser generator 21 may stand by at the second standby position and move to the second supply position to irradiate the laser.

In addition, the support unit 50 may rotate (see reference numeral S). Since the support 25 of the laser module 20 performs an arc motion, if the support unit 50 does not move, the laser generator 21 cannot irradiate a laser to some regions of the photomask PM. Accordingly, the support unit 50 rotates about the axis, so that the laser generator 21 can irradiate the laser to all the regions of the photomask PM. For example, the support unit 50 stops after rotating by a first angle and the laser generator 21 may irradiate a laser to the first target position, and the support unit 50 stops after rotating by a second angle again and the laser generator 21 may irradiate the laser to the second target position.

Meanwhile, the second standby position, at which the laser module 20 stands by, may be the home port 90. In the drawing, although the home port 90 is illustrated as being disposed on one side (e.g., one side in the X direction) in the process chamber 10, the present invention is not limited thereto.

A beam profiler 99 is disposed in the home port 90. The laser module 20 may irradiate a laser to the beam profiler 99, and measure an intensity profile of the laser provided by the laser module 20 through the beam profiler 99.

The controller 100 controls the support unit 50, the chemical solution supply unit 30, the laser module 20, the home port 90, and the like.

In particular, according to the photomask correction apparatus 1 according to some embodiments of the present invention, the photomask PM enters the process chamber 10 and before performing the correction process of the entered photomask PM, the intensity profile of the laser is measured, and the process parameters of the laser may be determined according to the measurement result.

Specifically, even if the same power is provided to the laser generator (e.g., a laser diode) 21, the output of the laser generator 21 may be different.

Here, referring to FIG. 3, the x-axis represents the period of use, and the y-axis represents the output. The output (i.e., intensity profile) of the laser generator (e.g., laser diode) 21 may be different depending on the beginning, middle, and end stages. When the lifetime of the laser generator 21 is 100%, 0 to 20% may correspond to the beginning stage, 20% to 80% may correspond to the middle stage, and 80% to 100% may correspond to the end stage. These divisions are merely exemplary and are not limited thereto. When the same power (i.e., the same current) is provided to the laser generator 21 of the beginning/middle/end stage, the output Tb of the laser generator 21 corresponding to the middle stage reaches the target value T, but the output Ta of the laser generator 21 corresponding to the beginning stage is greater than the target value T, and the output Tc of the laser generator 21 corresponding to the end stage is smaller than the target value T.

As described above, the etching amount of the photomask PM varies according to the degree of heating of the chemical solution. However, since the output of the laser generator 21 may vary according to the period of use of the laser generator 21, the degree, to which the chemical solution is heated, may vary according to the period of use of the laser generator 21. Accordingly, the etching amount of the photomask PM is changed, and thus the etching amount may be excessively etched or less etched than the target etching amount.

However, in the photomask correction apparatus according to some embodiments of the present invention, before the correction process of the photomask PM is performed, the laser module 20 irradiates a laser to the beam profiler 99 to measure the intensity profile of the laser. According to the measurement result, the controller 100 may adjust the etching amount of the photomask PM to the target value by changing the process conditions related to the laser.

Figure 4:
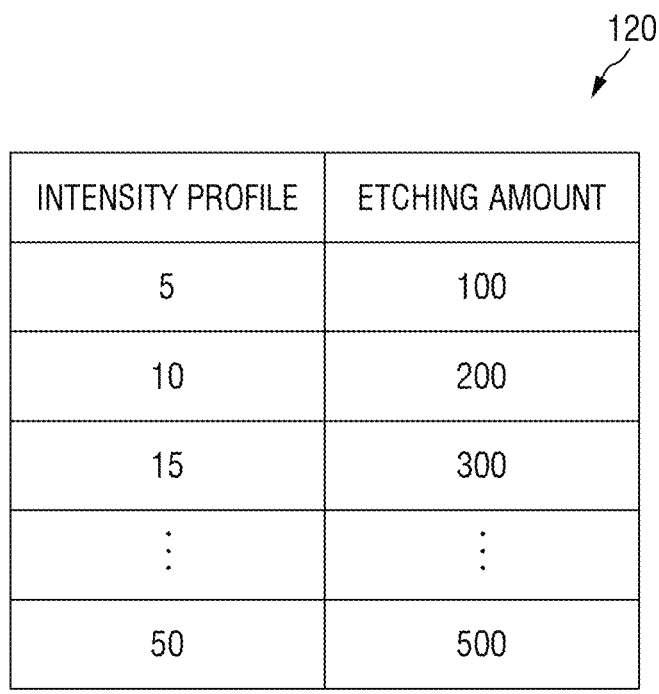

Here, with reference to FIGS. 4 and 5, a method for the controller 100 to change the process conditions related to the laser will be described. FIGS. 4 and 5 are diagrams for describing a library stored in the storage unit of FIG. 2.

As described above, the storage unit 110 includes a library including etching amount data corresponding to the intensity profile of the laser.

The storage unit 110 may include non-volatile memory (e.g., OTPROM (one time programmable ROM), PROM, EPROM, EEPROM, mask ROM, flash ROM, flash memory, PRAM, RRAM, MRAM, hard drive, or SSD (solid state drive)) and/or volatile memory (e.g., DRAM, SRAM, or SDRAM). The storage unit 110 may include an internal memory and/or an external memory.

The library 120 shown in FIG. 4 includes an etching amount corresponding to the intensity profile of the laser. The values presented in FIG. 4 are merely exemplary. When the intensity profile measured through the beam profiler 99 is 10, the controller 100 may expect that the etching amount is 200 through the library 120. If the target value is 200, the process parameters related to the laser are not changed. If the target value is 300, the process parameters related to the laser are changed. For example, by increasing the irradiation time of the laser, the time during which the chemical solution is heated by the laser is increased. If the target value is 100, by reducing the irradiation time of the laser, the time during which the chemical solution is heated by the laser is reduced. How much to change the process parameters may be determined according to pre-prepared logic. For example, in order to increase the etching amount by 10%, the irradiation time may be increased by 10%, but is not limited thereto. In addition, process parameters other than the laser irradiation time may include, for example, an interval between a laser and a photomask, a chemical solution concentration, and the like.

The library 121 shown in FIG. 5 includes a laser intensity profile, a process parameter, and an etching amount corresponding to them.

In the library 121, there are process parameters (C11, C12, C21, C22, C31, C32, C91, C92) of a plurality of cases for each intensity profile, and an etching amount corresponding to each case is described. For example, when the intensity profile is 10 and the process parameter is C21 (irradiation time is 10), the etching amount may be 200, and when the process parameter is C22 (irradiation time is 15), the etching amount may be 250.

When the intensity profile measured through the beam profiler 99 is 10 and the current process parameter is C21 (irradiation time is 10), the controller 100 may expect that the etching amount is 200 through the library 120. If the target value is 200, the process parameters related to the laser are not changed. If the target value is 250, the process parameters related to the laser are changed. For example, by changing the process parameter to C22 (by increasing the irradiation time to 15), the time during which the chemical solution is heated by the laser is increased. The controller 100 may refer to the library 121 for how much to change the process parameter. If the target value of the etching amount does not exist in the library 121, it may be determined according to a previously prepared logic.

Figure 6:
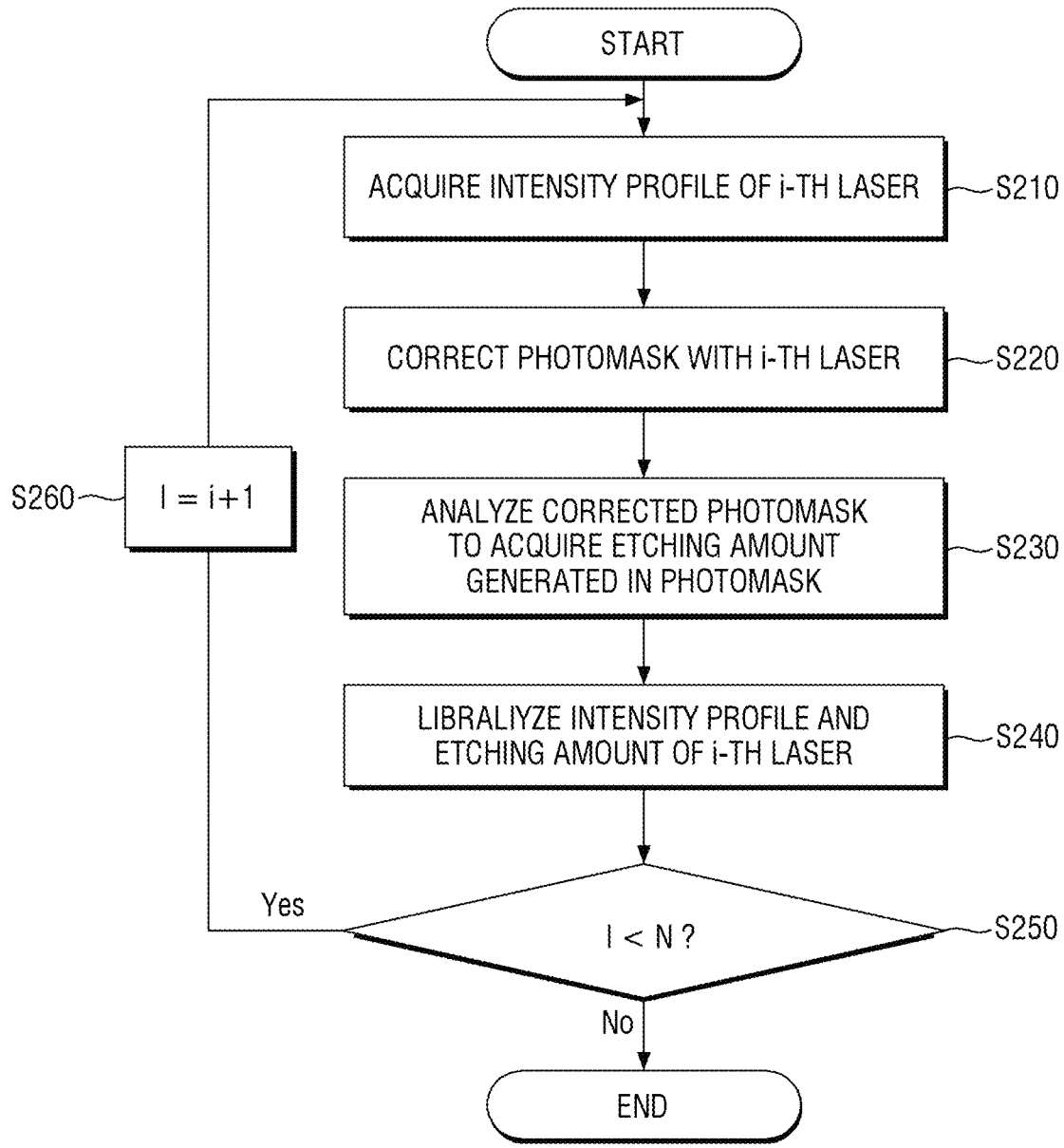
FIG. 6 is a flowchart illustrating a method of generating a library.

Here, a method of generating the libraries 120 and 121 using FIG. 6 will be described. FIG. 6 is a flowchart illustrating a method of generating a library.

Referring to FIG. 6, a description will be given of generating a library by testing N lasers. The N lasers may have different intensity profiles or may have different process parameters (irradiation time, an interval between the laser and the photomask, etc.).

First, the intensity profile of the i-th laser is acquired (S210). For example, the i-th laser is irradiated to the beam profiler, and the intensity profile of the i-th laser is acquired through the beam profiler. For example, by irradiating the i-th laser to the beam profiler, an image of the i-th laser is acquired at the beam profiler. By dividing the acquired image into a plurality of first pixels, and acquiring an intensity from each of the plurality of first pixels, an intensity profile in units of pixels may be acquired.

Next, the photomask is corrected with the i-th laser (S220). Specifically, a chemical solution is supplied to the photomask to form a liquid film on the photomask, and an i-th laser is irradiated to the liquid film to heat a target region of the liquid film. The photomask is etched by the heated chemical solution.

Next, by analyzing the corrected photomask, an etching amount generated from the photomask is acquired (S230). Specifically, an image of the corrected photomask is acquired using an electron microscope. The acquired image may be divided into a plurality of second pixels, and an etching amount may be acquired from each of the plurality of second pixels to acquire an etching amount in units of pixels. The electron microscope may be, for example, scanning electron microscopes (SEM), transmission electron microscopes (TEM), or the like.

Next, the intensity profile and etching amount of the i-th laser are liberalized (S240).

Next, it is identified whether i is less than N (S250). If i is less than N, 1 is added to i, and the process returns to S210 (S260). If i is equal to N, library generation is terminated.

An operation of the photomask correction apparatus according to some embodiments of the present invention will be described with reference to FIGS. 7 to 11.

Figure 7:
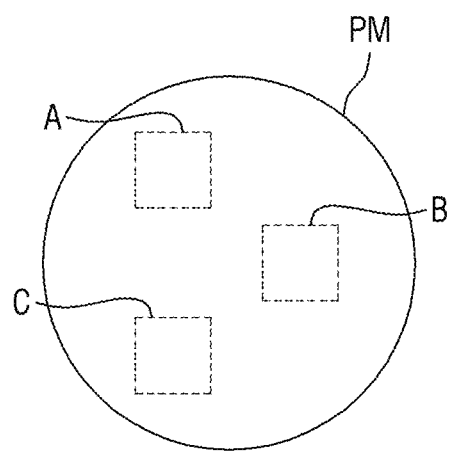
FIG. 7 is a plan view of a photomask.
Figure 8:
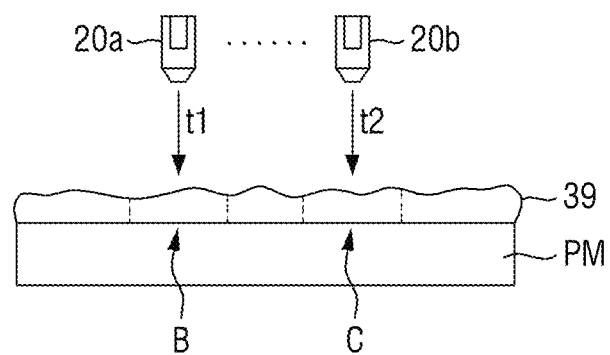
FIG. 8 is a view for describing the operation of the laser module.
Figure 9:
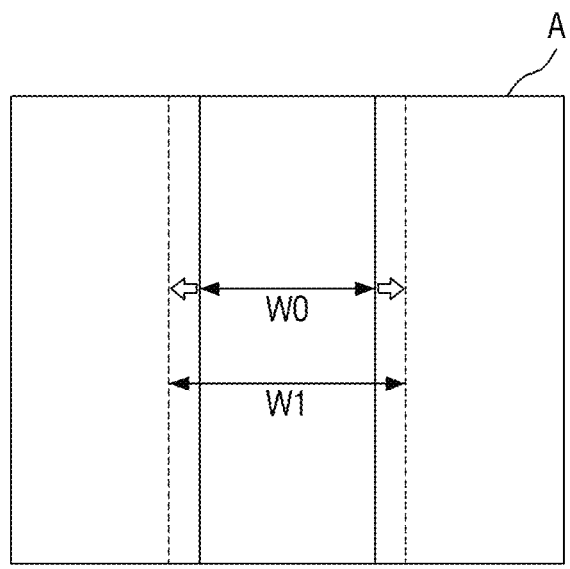
FIG. 9 is a view for describing an etching process performed in region A of FIG. 7.
Figure 10:
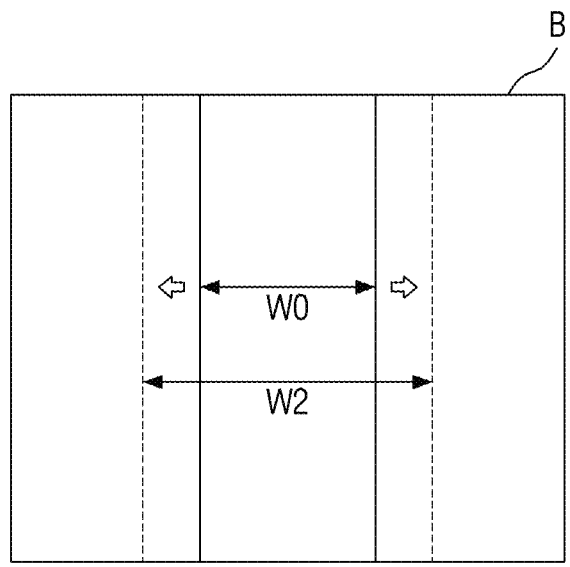
FIG. 10 is a view for describing an etching process performed in region B of FIG. 7.
Figure 11:
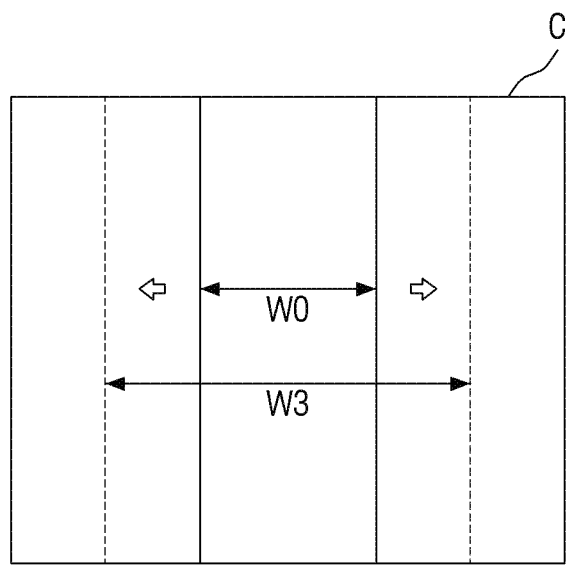
FIG. 11 is a view for describing an etching process performed in region C of FIG. 7; and An operation of the photomask correction apparatus according to some exemplary embodiments will be described with reference to FIGS. 12 to 16.

FIG. 7 is a plan view of a photomask. FIG. 8 is a view for describing the operation of the laser module. FIG. 9 is a view for describing an etching process performed in region A of FIG. 7. FIG. 10 is a view for describing an etching process performed in region B of FIG. 7. FIG. 11 is a view for describing an etching process performed in region C of FIG. 7.

Referring to FIGS. 7 and 8, the photomask PM includes a first region A, a second region B, and a third region C, which are different from each other.

The chemical solution 39 is applied on the upper surface of the photomask PM.

The first region A is a region, in which heating by a laser is unnecessary, the second region B is a region requiring more etching amount than the first region A, and the third region C is a region requiring more etching amount than the second region B.

As shown in FIG. 8, the laser module 20a irradiates the laser to the chemical solution 39 on the second region B for t1 time. In addition, the laser module 20b irradiates the laser to the chemical solution 39 on the second region B for t2 time, which is greater than t1 time. For example, the output per unit time of the laser module 20a and the output per unit time of the laser module 20b are the same.

Here, referring to FIG. 9, the width of the trench formed in the first region A of the photomask PM before the correction process is W0. The trench is etched by the chemical solution 39 without being heated by the laser, so that the width becomes W1.

Referring to FIG. 10, the trench is etched by the chemical solution 39 heated by the laser module 20a for time t1, so that the width becomes W2.

Referring to FIG. 11, the trench is etched by the chemical solution 39 heated by the laser module 20b for a time t2 greater than time t1, so that the width become W3 greater than W2.

The irradiation times t1 and t2 may be determined by the controller (see 100 in FIG. 1) referring to the library stored in the storage unit (see 110 in FIG. 1).

An operation of the photomask correction apparatus according to some exemplary embodiments will be described with reference to FIGS. 12 to 16.

Figure 12:
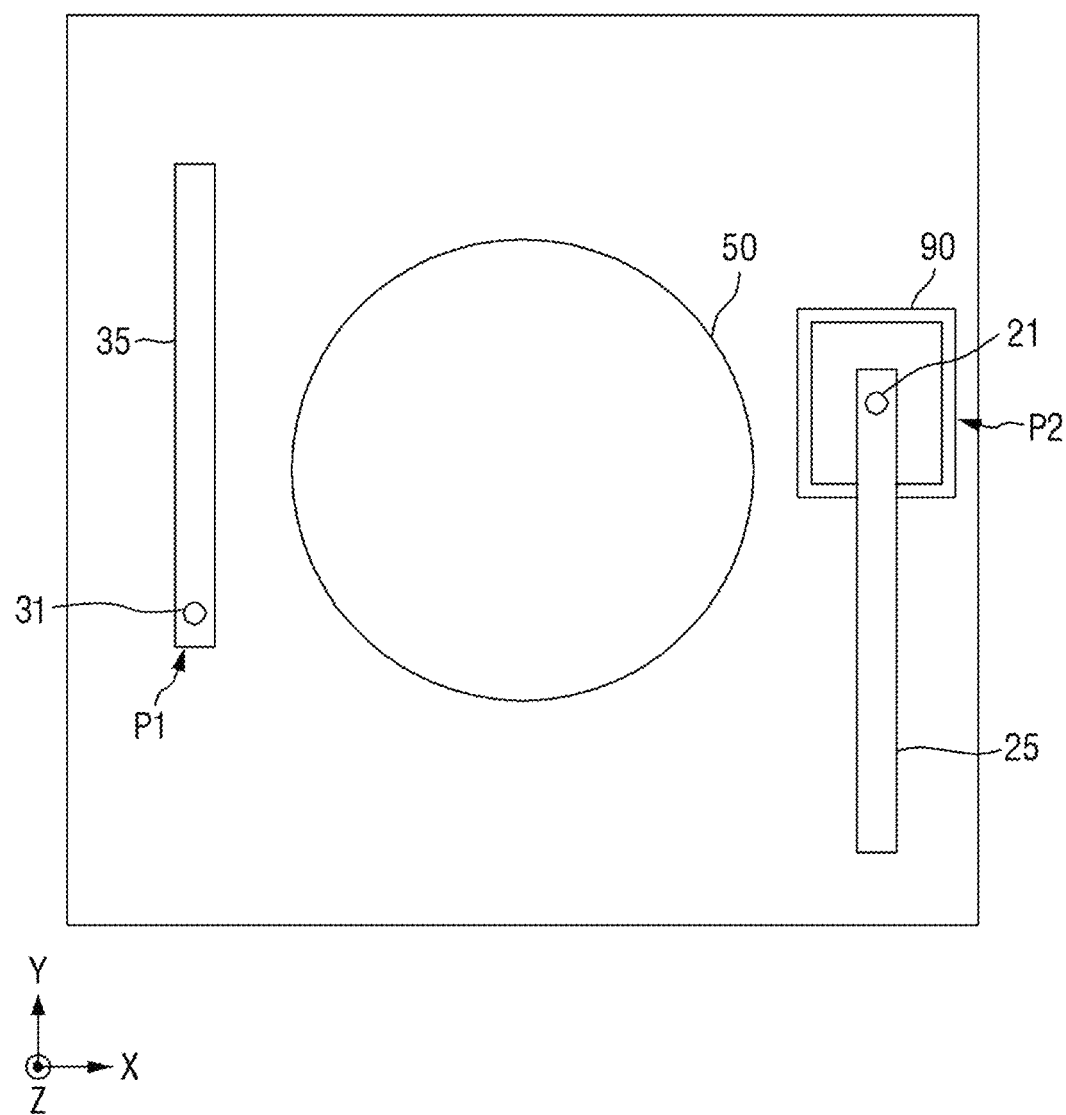

Referring to FIG. 12, the photomask PM is not introduced into the process chamber 10. The nozzle 31 of the chemical solution supply unit 30 stands by at the first standby position P1. The laser generator 21 of the laser module 20 stands by at the second standby position P2. While the laser generator 21 stands by, the laser generator 21 supplies a laser to the beam profiler 99 installed in the home port 90. The intensity profile of the laser generator 21 is measured through the beam profiler 99.

Figure 13:
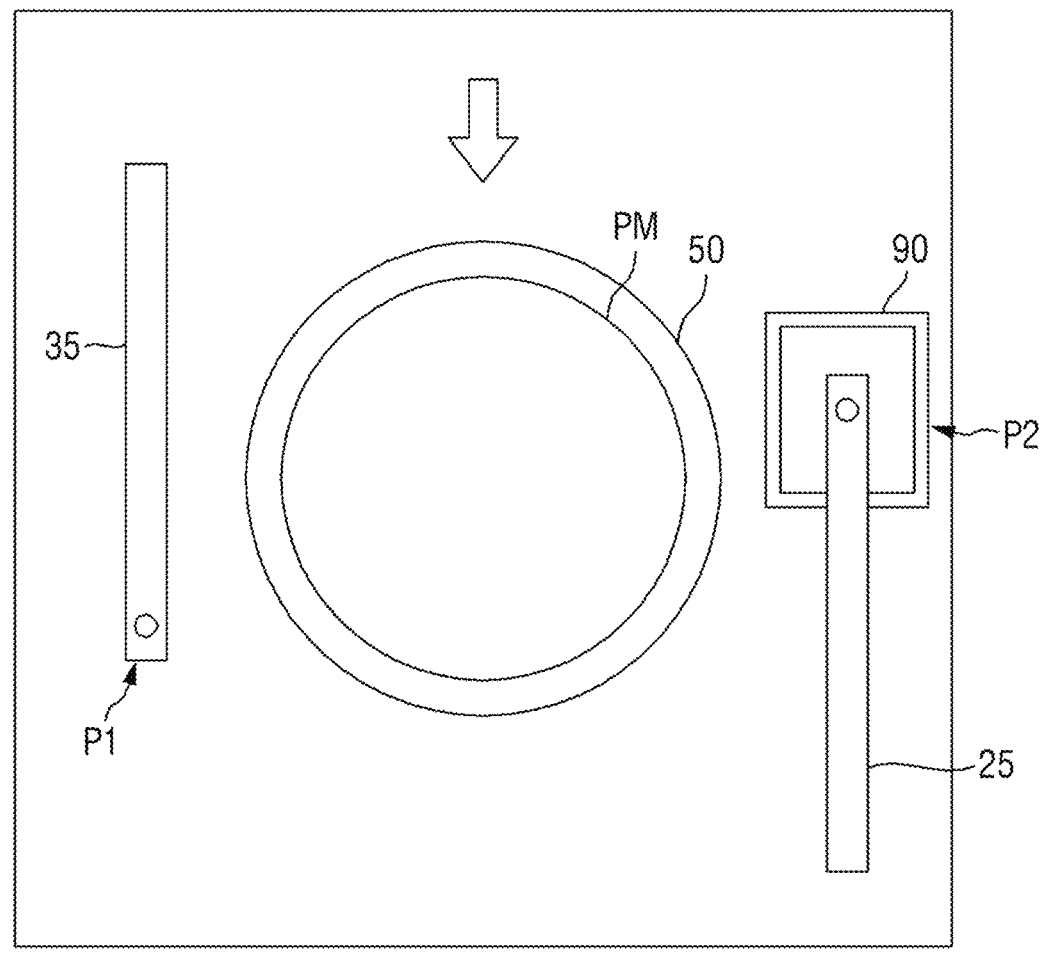

Referring to FIG. 13, the photomask PM is introduced into the process chamber 10, and the photomask PM is seated on the support unit 50.

Figure 14:
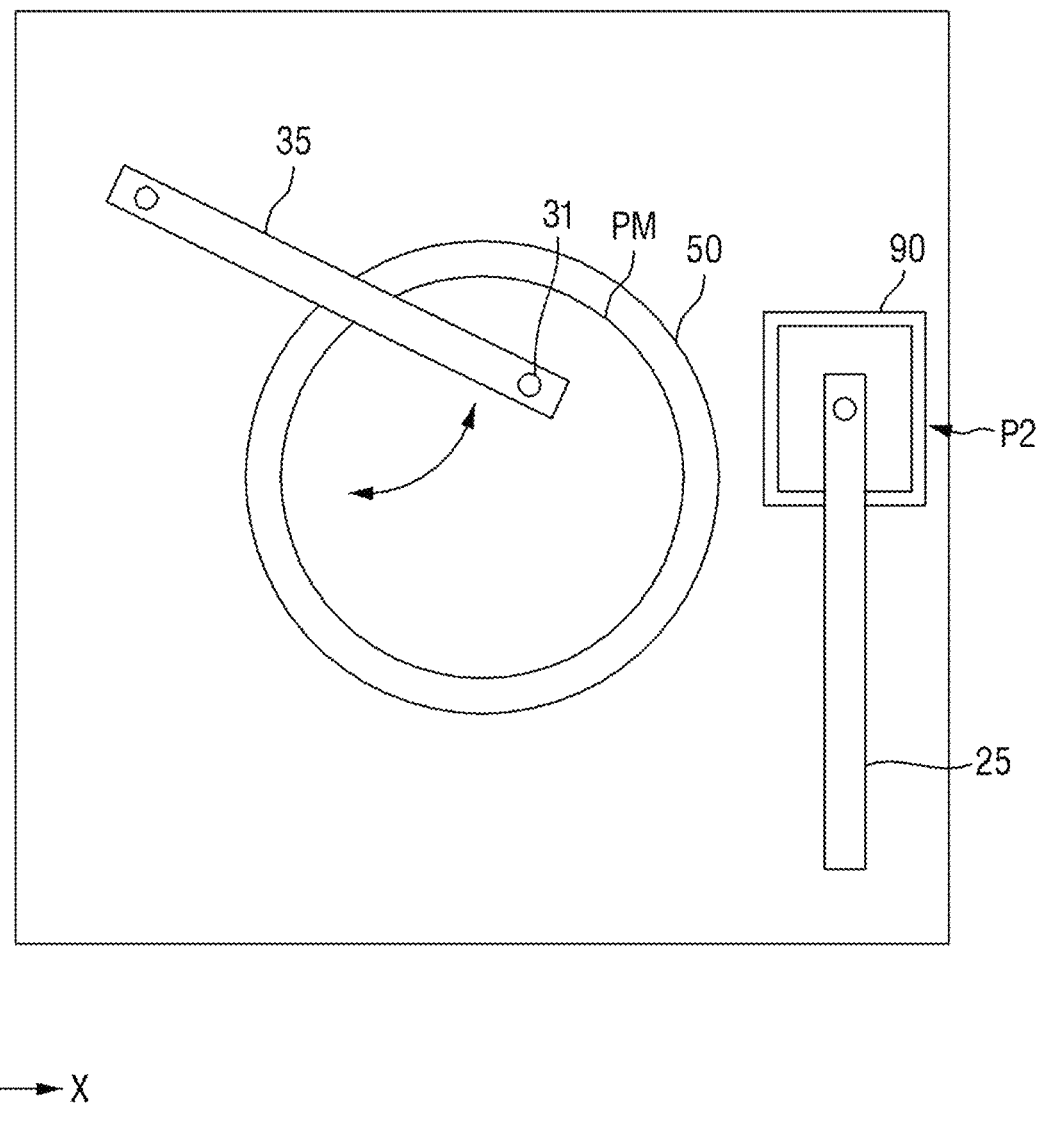

Referring to FIG. 14, the nozzle 31 of the chemical solution supply unit 30 moves to an upper portion of the photomask PM to supply the chemical solution to the photomask PM. A liquid film is formed on the photomask PM.

Figure 15:
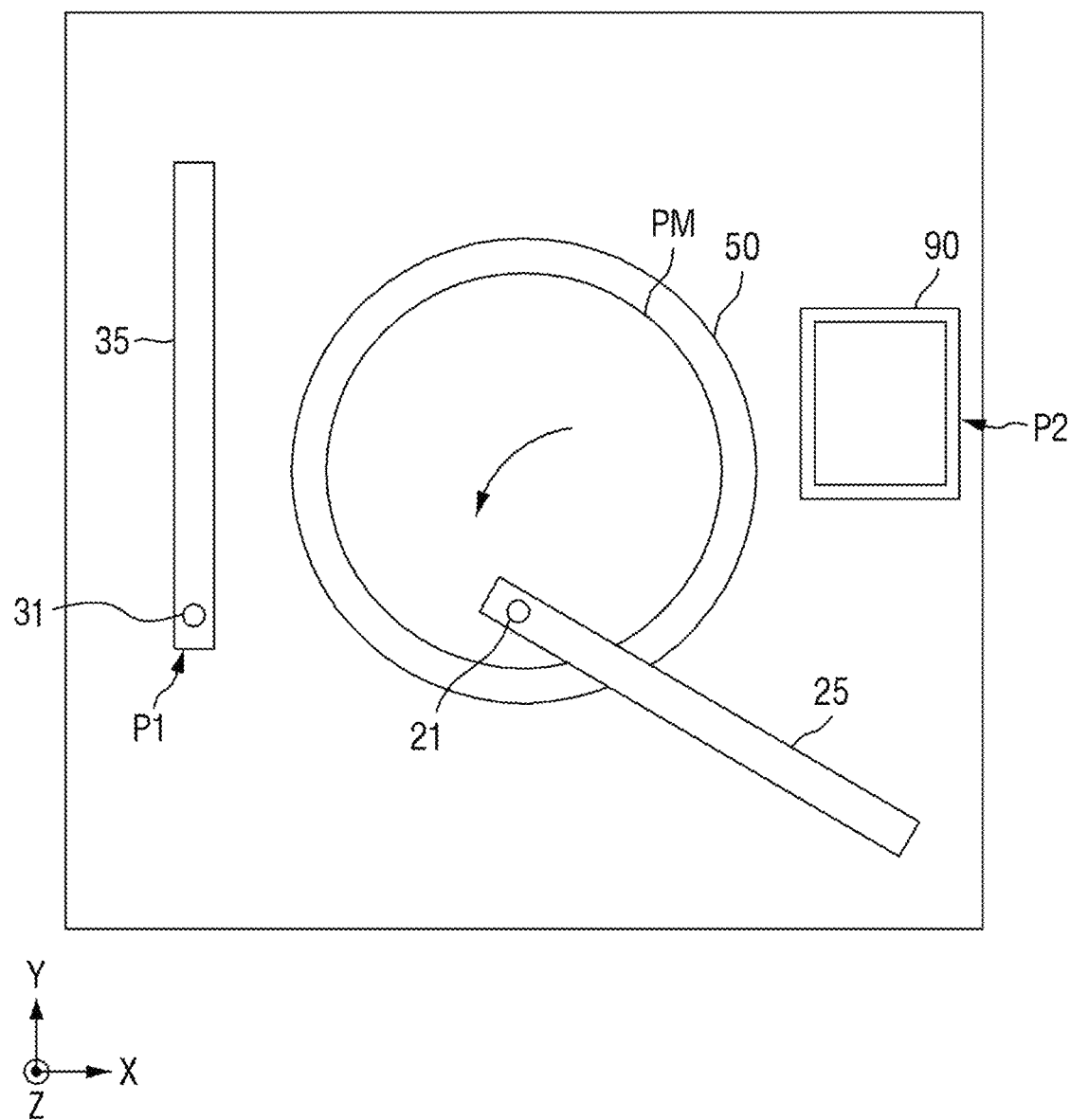

Referring to FIG. 15, the nozzle 31 of the chemical solution supply unit 30 returns to the first standby position P1 again. The laser generator 21 of the laser module 20 moves onto the third region (see C of FIG. 7) of the photomask PM. The laser generator 21 irradiates a laser to the chemical solution located in the third region C for t2 time.

Figure 16:
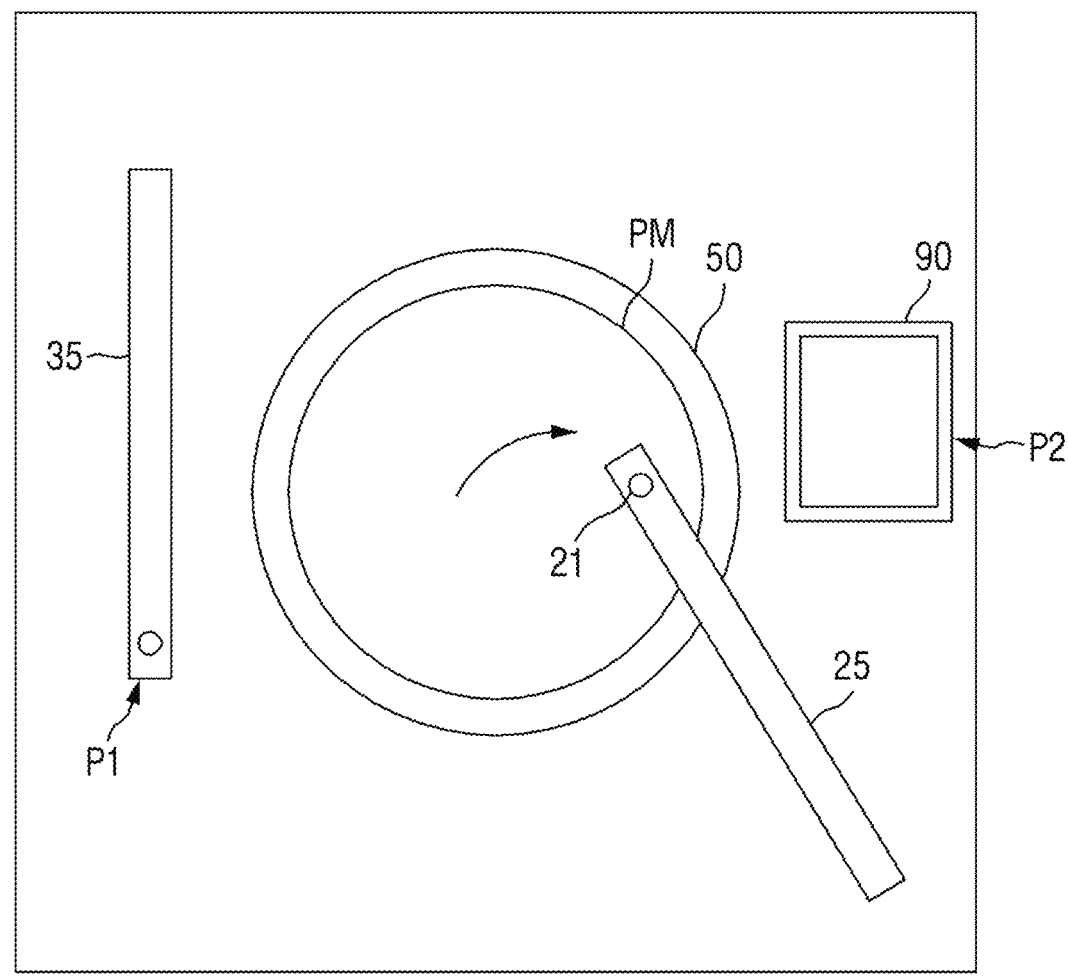

Referring to FIG. 16, the laser generator 21 of the laser module 20 moves onto the second region (see B of FIG. 7) of the photomask PM. The laser generator 21 irradiates a laser to the chemical solution located in the second region B for t1 time.

The irradiation times t1 and t2 may be determined by the controller (see 100 in FIG. 1) referring to the library stored in the storage unit (see 110 in FIG. 1).

Although embodiments of the present invention have been described with reference to the above and the accompanying drawings, those skilled in the art, to which the present invention pertains, can understand that the present invention may be practiced in other specific forms without changing its technical spirit or essential features. Therefore, it should be understood that the embodiments described above are illustrative in all respects and not limiting.

What is claimed is:

1. A method for correcting a photomask comprising:
   measuring an intensity profile of a laser,
   acquiring etching amount data corresponding to the measured intensity profile using a library,
   determining a process parameter of the laser based on the etching amount data, and
   correcting a photomask with the laser according to the determined process parameter.

2. The method of claim 1, wherein measuring the intensity profile of the laser comprises,
   irradiating the laser to a beam profiler, and acquiring an intensity profile through the beam profiler.

3. The method of claim 1, wherein correcting the photomask with the laser comprises,
   forming a liquid film by a chemical solution on the photomask,
   wherein the photomask includes a first region and a second region that are different from each other,
   wherein a liquid film in the first region is not heated by the laser, and a liquid film in the second region is heated by the laser.

4. The method of claim 3, wherein the photomask further includes a third region,
   wherein a liquid film in the second region is heated by the laser for a first irradiation time,
   wherein a liquid film in the third region is heated by the laser for a second irradiation time longer than the first irradiation time.

5. The method of claim 1, wherein the process parameter includes at least one of a laser irradiation time, a chemical solution concentration, and an interval between a laser and a photomask.

6. The method of claim 1 further comprises,
   generating the library before measuring an intensity profile of the laser,
   wherein generating the library comprises,
   irradiating a first laser to a beam profiler, and acquiring a first intensity profile of the first laser through the beam profiler,
   correcting the photomask with the first laser,
   analyzing the corrected photomask to acquire a first etching amount generated in the photomask, and
   liberalizing the first intensity profile and the first etching amount.

7. The method of claim 6, wherein acquiring the first intensity profile of the first laser through the beam profiler comprises,
   acquiring a first image of the first laser through the beam profiler,
   dividing the first image into a plurality of first pixels, and
   acquiring an intensity from each of the plurality of first pixels to acquire a first intensity profile in units of pixels.

8. The method of claim 6, wherein analyzing the corrected photomask comprises,
acquiring a second image from the corrected photomask using an electron microscope,
dividing the second image into a plurality of pixels, and
acquiring an etching amount from each of the plurality of second pixels to acquire the first etching amount in units of pixels.

9. The method of claim 1, wherein measuring the intensity profile of the laser is performed while a laser generator irradiating the laser stands by at a home port,
wherein the photomask enters into a process chamber while the laser generator stands by at a home port.

10. A method for correcting a photomask comprising:
measuring an intensity profile of a laser provided from a laser generator using a beam profiler installed in a home port while the laser generator stands by at the home port,
forming a liquid film by supplying a chemical solution onto a photomask including a first region and a second region,
acquiring etching amount data corresponding to the measured intensity profile by using a library including a plurality of intensity profiles and a plurality of etching amount data corresponding to the plurality of intensity profiles,
determining an irradiation time of the laser based on the etching amount data, and
heating a liquid film in the second region with the laser for the determined irradiation time without heating a liquid film in the first region.

11. The method of claim 10, wherein the photomask further comprises a third region,
wherein determining the irradiation time of the laser based on the etching amount data comprises,
determining that a liquid film in the second region is heated for a first irradiation time, and a liquid film in the third region is heated for a second irradiation time longer than the first irradiation time.

12. The method of claim 10 further comprises,
generating the library before measuring an intensity profile of the laser,
wherein generating the library comprises,
irradiating a first laser to a beam profiler, and acquiring a first intensity profile of the first laser through the beam profiler,
correcting the photomask with the first laser,
analyzing the corrected photomask to acquire a first etching amount generated in the photomask, and
liberalizing the first intensity profile and the first etching amount.

13. The method of claim 12, wherein acquiring the first intensity profile of the first laser through the beam profiler comprises,
acquiring a first image of the first laser through the beam profiler,
dividing the first image into a plurality of first pixels,
acquiring an intensity from each of the plurality of first pixels to acquire a first intensity profile in units of pixels,
wherein analyzing the corrected photo mask comprises,
acquiring a second image from the corrected photomask using an electron microscope,
dividing the second image into a plurality of pixels, and
acquiring an etching amount from each of the plurality of second pixels to acquire the first etching amount in units of pixels.

14. An apparatus for correcting a photomask comprising:
a process chamber;
a support unit installed in the process chamber and for supporting a photomask;
a chemical solution supply unit installed in the process chamber and for supplying a chemical solution to the photomask to form a liquid film;
a laser module installed in the process chamber and including a laser generator for irradiating a laser to the liquid film;
a home port for measuring an intensity profile of the laser, in which the laser generator stands by;
a storage unit for storing a library including a plurality of intensity profiles and a plurality of etching amount data corresponding to the plurality of intensity profiles; and
a controller for acquiring etching amount data corresponding to the measured intensity profile using the library, determining a process parameter of the laser based on the etching amount data, and correcting a photomask with the laser according to the determined process parameter.

15. The apparatus of claim 14, wherein a beam profiler is installed in the home port, the laser is irradiated to the beam profiler, and the intensity profile of the laser is acquired through the beam profiler.

16. The apparatus of claim 14, wherein the photomask includes a first region and a second region that are different from each other,
wherein a liquid film in the first region is not heated by the laser, and a liquid film in the second region is heated by the laser.

17. The apparatus of claim 16, wherein the photomask further includes a third region,
wherein a liquid film in the second region is heated by the laser for a first irradiation time,
wherein a liquid film in the third region is heated by the laser for a second irradiation time longer than the first irradiation time.

18. The apparatus of claim 14, wherein the process parameter includes at least one of a laser irradiation time, a chemical solution concentration, and an interval between a laser and a photomask.

19. The apparatus of claim 14, wherein measuring the intensity profile of the laser is performed while the laser generator stands by at a home port.

20. The apparatus of claim 19, wherein the laser generator stands by at a home port while the photomask is entered into the process chamber.

* * * * *